(12) United States Patent
Kumar et al.

(10) Patent No.: US 8,531,227 B2
(45) Date of Patent: Sep. 10, 2013

(54) LEVEL SHIFTER

(75) Inventors: Vinod Kumar, Greater Noida (IN); Saiyid Mohammad Irshad Rizvi, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 130 days.

(21) Appl. No.: 12/960,179

(22) Filed: Dec. 3, 2010

(65) Prior Publication Data
US 2012/0013386 A1 Jan. 19, 2012

(30) Foreign Application Priority Data
Jul. 16, 2010 (IN) .......................... 1670/DEL/2010

(51) Int. Cl.
*H03L 5/00* (2006.01)

(52) U.S. Cl.
USPC .................................................. 327/333

(58) Field of Classification Search
USPC ................................................... 327/333
See application file for complete search history.

(56) References Cited

U.S. PATENT DOCUMENTS

| | | | | |
|---|---|---|---|---|
| 4,703,199 A | * | 10/1987 | Ely | 327/333 |
| 5,786,723 A | * | 7/1998 | Kim | 327/530 |
| 6,487,687 B1 | | 11/2002 | Blake et al. | |
| 6,693,469 B2 | | 2/2004 | Prodanov | |
| 7,019,560 B2 | * | 3/2006 | Wimmer et al. | 326/96 |
| 7,068,091 B1 | * | 6/2006 | Kwong | 327/333 |
| 7,215,146 B2 | | 5/2007 | Khan | |
| 7,425,860 B2 | * | 9/2008 | Nomura | 327/333 |
| 7,696,805 B2 | * | 4/2010 | Thorp et al. | 327/333 |
| 7,777,548 B2 | * | 8/2010 | Kang | 327/333 |
| 7,884,646 B1 | * | 2/2011 | Bourstein | 326/81 |

* cited by examiner

Primary Examiner — William Hernandez
(74) Attorney, Agent, or Firm — Hogan Lovells US LLP

(57) ABSTRACT

A level shifter includes an output stage transistor and a level controller. The level controller receives a selection signal and provides a reference voltage at a gate terminal of the output stage transistor based on the selection signal. The output stage transistor, on being enabled by the reference voltage, provides a first level shifted output based on a first output reference voltage.

16 Claims, 5 Drawing Sheets

LEVEL SHIFTER

RELATED APPLICATION

The present application claims priority of India Application No. 1670/DEL/2010 filed Jul. 16, 2010, which is incorporated herein in its entirety by reference.

TECHNICAL FIELD

The present subject matter, in general, relates to an integrated circuit (IC), and, in particular, relates to level shifters in the IC.

BACKGROUND

With the recent advancements in integrated circuit (IC) technology, ICs are becoming increasingly compact. With the reduction in size of transistors on the ICs, the power supply voltage provided to the ICs is also being reduced. As a result, the IC standards have shifted focus from 5 Volts (V) and 3.3 V power supply to lower voltages, such as 2.5 V and 1.8 V. However, new system components, based on the new standards of lower power supply, should be backward compatible with the existing system components operating on 3.3 V power supply. For this, various schemes offer mixed voltage integrated circuits, for example, level shifters, which enable a circuit operating at a low voltage to communicate with another circuit operating at a high voltage.

Generally, the level shifters use thick oxide transistors, i.e., dual oxide layer gate transistors that can tolerate higher voltage. For example, a 3.3V level shifter is designed using transistors that can tolerate up to 3.3V potential difference. However, the usage of thick oxide transistors often involves operational problems when operated at lower voltages. For example, the thick oxide transistors for 3.3V are not able to provide high speed operation for devices operated at 2.5V or 1.8V, such as high speed processors. In addition, the thick oxide transistors also cover substantial chip area when operated at low voltages. Further, the thick oxide transistors are not configurable with ICs that have core operating at low power supply as the threshold voltage required to operate the thick oxide transistors is more than the available low power supply.

Thus, certain schemes have been devised to implement higher voltage level shifters using transistors recommended for low voltage application. For example, 32 Å thick oxide transistors have been implemented in the 3.3V level shifters. However, the 32 Å thick oxide transistors work at lower supply voltages, e.g., 1.8 V and may not be able to support high voltage overdrives, thus causing reliability issues. Some schemes suggest the use of a level shifter, which has transistors in cascode circuit arrangements to limit voltage stress on transistors operating as switching transistors. Such a cascode circuit arrangement of 32 Å thick oxide transistors generally operates either on the basis of an internally generated reference or at a low supply voltage as a biasing voltage to avoid stress. However, the level shifter may not be able to operate when the difference between an output high voltage and the biasing voltage is low. Further, the use of a reference voltage generator for providing an internally generated reference voltage results in increase in the chip area and may lead to leakage of current from the generator. Additionally, it is often observed that the problem of stress on the switching transistors increases with increase in switching frequency.

SUMMARY

This summary is provided to introduce concepts related to a level shifter, which are further elaborated in the detailed description. This summary is not intended to identify essential features of the claimed subject matter nor is it intended for use in determining or limiting the scope of the claimed subject matter.

The level shifter includes at least one output stage transistor and at least one level controller. The level controller is configured to receive a selection signal and provide a reference voltage at a gate terminal of the output stage transistor based at least on the selection signal. The output stage transistor, on being enabled by the reference voltage, conducts a first output reference voltage as a first level shifted output of the level shifter. Further, the level shifter is configured to provide multiple level outputs.

These and other features, aspects, and advantages of the present subject matter will be better understood with reference to the following description and appended claims. This summary is provided to introduce a selection of concepts.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components. For simplicity and clarity of illustration, elements in the figures are not necessarily to scale.

DETAILED DESCRIPTION

The disclosed subject matter relates to level shifters in IC. Particularly, the subject matter relates to a level shifter of an IC that is configured to operate at a high speed and frequency.

With the advent of nanotechnology, IC dimensions are decreasing to make the ICs suitable for low power and low cost applications. These ICs operate at various voltage levels to drive devices operating on different voltage standards. For example, the IC core operates at a low voltage, say in the order of 0.7 V, while the peripheral devices operate at high supply voltage, say in the order of 3.3 V.

In order to facilitate communication between the core and the peripheral devices operating at different voltages, conversion of the voltage levels is required to ensure that the devices are compatible with each other. Such a voltage level conversion is typically accomplished through a level shifter. Generally, the level shifters use thick oxide transistors, such as 50 Angstroms (Å) transistors, which can shift the voltage up to 3.6 V. However, the level shifters using 50 Å thick oxide transistors are not compatible with high-speed ICs. Thus, in certain schemes, transistors having gate oxide thickness less than 50 Å have been implemented in level shifters. For example, 32 Å thick oxide transistors have been implemented in the level shifters. However, the 32 Å thick oxide transistors work at low supply voltage, e.g., 1.8 V, and may not be able to support high voltage overdrives, thus causing reliability issues.

Figure 1B:
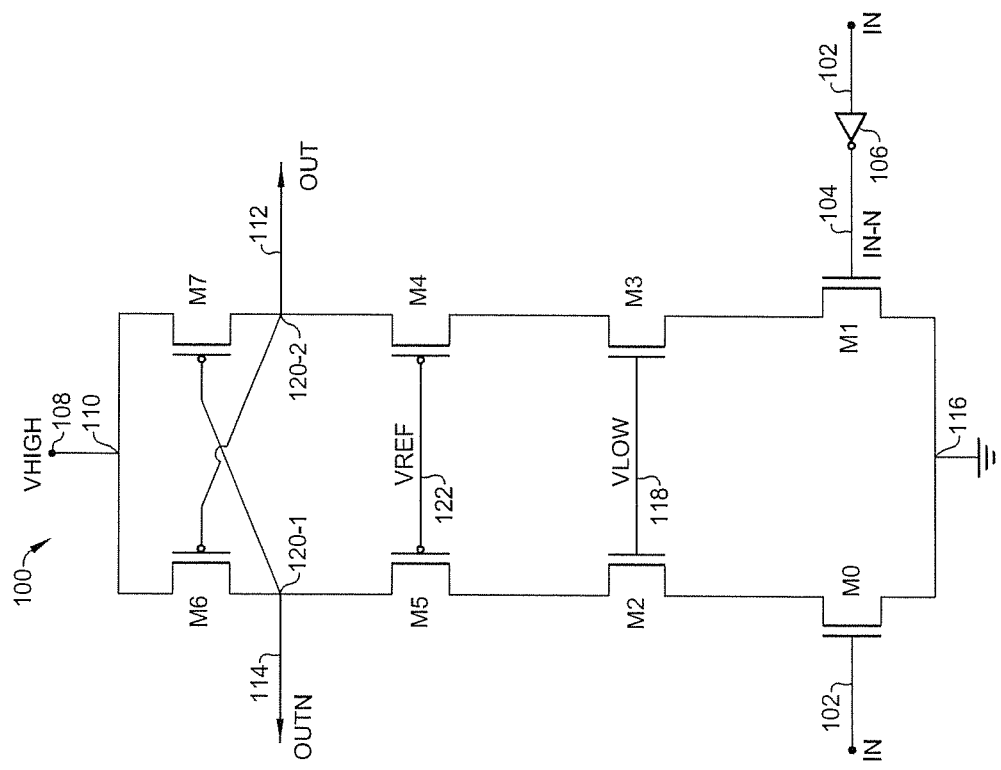
FIGS. 1(a) and 1(b) illustrate circuit configurations of a conventional level shifter 100.
Figure 1A:
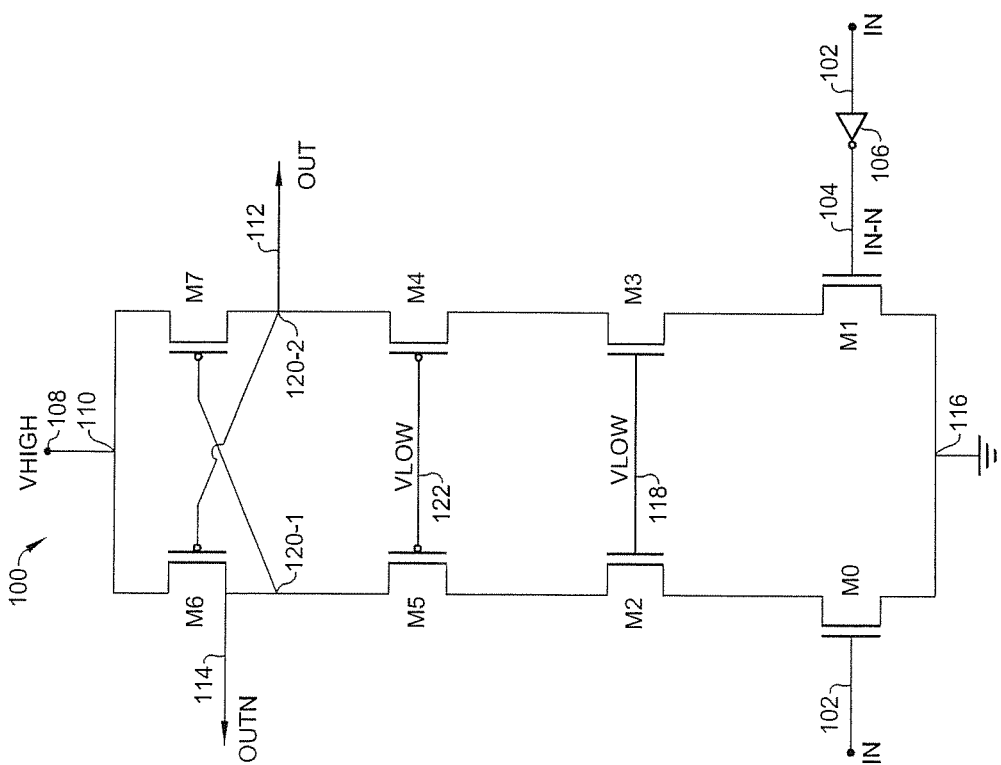

To increase the speed, the 32 Å thick oxide transistors are generally arranged in a cascode arrangement. FIGS. 1(a) and 1(b) illustrate circuit configurations of a conventional level shifter 100. The level shifter 100 is implemented using both 32 Å pMOS and nMOS transistors M0, . . . , M7. The connections between the transistors are depicted in the circuit configuration. Additionally, descriptions and details of well-known components are omitted for simplicity of the description. The cascode circuit arrangement of the level shifter 100 generally operates on the basis of either the low supply voltage as biasing voltage, as shown in FIG. 1(a), or an internally generated reference voltage, as shown in FIG. 1(b), for cascode transistors to avoid stress on the 32 Å thick oxide transistors.

Input signals IN 102 and IN-N 104 are logic signals, which may take a value of either '0' or '1' corresponding to a low and a high voltage. It may also be noted that the logic signals '0' and '1' are digital signals and can represent any value of voltage as per the circuit configuration. For example, '0' may correspond to 0 Volt and '1' may correspond to either 1 Volt, 1.2 Volts, 1.8 Volts or any other voltage depending on the circuit requirement. The input signal IN 102 and the inverted input signal IN-N 104 are provided to the two nMOS transistors M0 and M1, respectively. Specifically, the input signal IN 102 is applied at the gate of the transistor M0, and to an inverter 106. The output of the inverter 106, i.e., inverted input signal IN-N 104 is applied at the gate of the transistor M1.

A power supply VHIGH 108 is coupled via a power supply node 110 to the source of the two pMOS transistors M6 and M7. The voltage of the power supply VHIGH 108 corresponds to a voltage level to which the inputs IN 102 or IN-N 104 may be selectively shifted. Thus, the shifted values of the inputs IN 102 and IN-N 104 depend on the power supply VHIGH 108 and are obtained as outputs OUT 112 and OUTN 114, respectively. Also, at a ground node 116, the source terminals of the transistors M0 and M1 are grounded.

To elucidate the working of the level shifter 100, the input signal IN 102 may be considered to be at the logic level 1 and accordingly the inverted input signal IN-N 104 may be at the logic level 0. The input signal IN 102 received at the gate of the transistor M0 switches the transistor M0 ON. Similarly, the inverted input signal IN-N 104 being provided at the gate of the transistor M1 causes the transistor M1 to turn non-conductive.

The transistor M0 gets triggered by the input signal IN 102 and, as a result, the transistor M0 pulls the transistor M2, which is triggered by a low supply voltage VLOW 118, down towards the ground 116. The gate of transistor M3 is also coupled to VLOW. The ground voltage thus appears at the drain of the transistor M5, i.e., which is a cascode transistor. The source of the transistor M5 discharges up to value, such as a threshold voltage (Vt) above the biasing voltage of the cascode transistors M4 and M5, i.e., VLOW 118. The threshold voltage Vt of the cascode transistor M5 gets added to the biasing voltage VLOW 118 and a voltage (VLOW+Vt) appears at a node 1201. The node 1201 is coupled to the gate of the transistor M7 and the voltage (VLOW+Vt) is thus provided as the gate voltage to the transistor M7. The node 1202 is coupled to the gate of transistor M6. Further, as will be known to a person skilled in the art, for a transistor to conduct, the difference between a source voltage and a gate voltage needs to be more than the threshold voltage of a transistor. Thus, the source voltage, i.e., the VHIGH 108 for the transistor M7 needs to be (VLOW+2Vt).

Thus, due to the addition of the threshold voltage to the gate voltage, the difference between the source voltage of the transistors M7 and M6, i.e., the VHIGH 108 and the biasing voltage gets low. The source voltage of such transistors therefore needs to be more than twice the threshold voltage in addition to the biasing voltage. For example, a transistor having oxide thickness of 32 Angstroms (Å), may have the threshold voltage of 0.7 V and thus the transistor may not be able to operate when the difference between the source voltage and the biasing voltage is less than 1.4 V. Thus, for the VLOW 118 equal to 1.98 V and the Vt equal to 0.7 V, the biasing voltage for the transistor M7 will be equal to 2.7 V. The source voltage VHIGH 108, thus needs to be more than 2.7 V+0.7 V, i.e., 3.4 V. The transistor M7 may thus not be able to operate efficiently for providing low output voltage, for example 3.0 V and 1.98 V.

The level shifters using low supply voltage as biasing voltage may thus not be able to operate efficiently if the difference between the low supply voltage and high supply voltage is small as the difference between the high supply voltage and the low output voltage needs to be more than 1.4 V.

Further, the level shifter 100 using an internally generated reference Vref 122, as shown in FIG. 1(b), requires an internal analog reference voltage generator (not shown in the figure) that leads to area consumption and may cause leakage of current from the generator. The REF voltage is coupled to the gate of transistors M4 and M5.

The embodiments described herein will help address the aforementioned issues in addition to providing several other advantages over the existing level shifters. The disclosed level shifter may be implemented in a variety of electronic circuits, such as flash memory circuits or electrically erasable programmable read-only memory (EEPROM) circuits, and accordingly finds application in numerous electronic devices, for example, computers, laptops, digital cameras, and so on.

The level shifter of the present subject matter has a circuit configuration that enables high-speed operation and provides multiple outputs. In one embodiment, the level shifter uses a cascode circuit of 32 Å thick oxide transistors, such as metal-oxide semiconductor field-effect transistors (MOSFETs) having gate oxide layer thickness of 32 Å, which have a voltage rating lower than the voltage output of the level shifter. This helps in maintaining compactness while achieving high speed. The circuit configuration provides a cascoded level shifting to overcome the reliability issues generally associated with the operation of a typical level shifter at high voltages and high speed. The level shifter is configured to use a low supply voltage, such as 1.8 V as a reference voltage and provide high output voltage, for example, 3.3 V.

The level shifter is further configured to provide multiple outputs, for example of values 1.8 V and 3.3. V. The level shifter, in one embodiment, includes a high level controller and a low level controller for providing the multiple outputs. The high level controller, in one implementation, includes 32 Å thick oxide transistors and a capacitor to provide the low supply voltage, for example, of a value 1.8 V as the reference voltage to a cascode circuit. The high level controller helps to discharge the source of the cascode transistor to the low level voltage, for example, of 1.8 V, due to which the difference desired between the biasing voltage and the output voltage to operate the level shifter is equal to only the threshold voltage, i.e., 0.7 V. The level shifter is thus able to provide low voltage level, for example, of 3.0 V for biasing voltage of 1.98 V.

Similarly, the low level controller, in one implementation, includes 32 Å thick oxide transistors and provides a low level voltage, for example, of zero volts to the source of the cascode transistor. The low level voltage acts as a reference voltage for the cascode transistor and prevents the leakage of current at the biasing level. Further, by providing the reference voltage, the source of the cascode transistor is pulled down to the zero by the low level controller due to which the level shifter may thus be able to provide low level voltage, for example, of 1.8 V for logic high input to the level shifter and 0V for logic low input to the level shifter.

The level shifter is thus able to provide multiple outputs, for example of 1.8 V and 3.3. V using the high level controllers and the low level controllers. The level shifter is provided with a selection signal to select the output voltage level required from the level shifter. The selection signal may enable the corresponding controller to provide the required voltage. Further, the level shifter, due to the use of 32 Å thick oxide transistors, operates at high speed and has a reduced chip area.

While aspects of described systems for the level shifter in an electronic device can be implemented in any number of different environments, and/or configurations, the embodiments are described in the context of the following exemplary system architecture (s).

The descriptions and details of well-known devices and components are omitted for simplicity of the description. Although the devices are explained as certain NMOS and PMOS devices, it can be appreciated that complementary devices are also possible in accordance with the present subject matter. Accordingly, the logic level of control signals can either be active low or active high.

Exemplary systems are now described.

Figure 2:
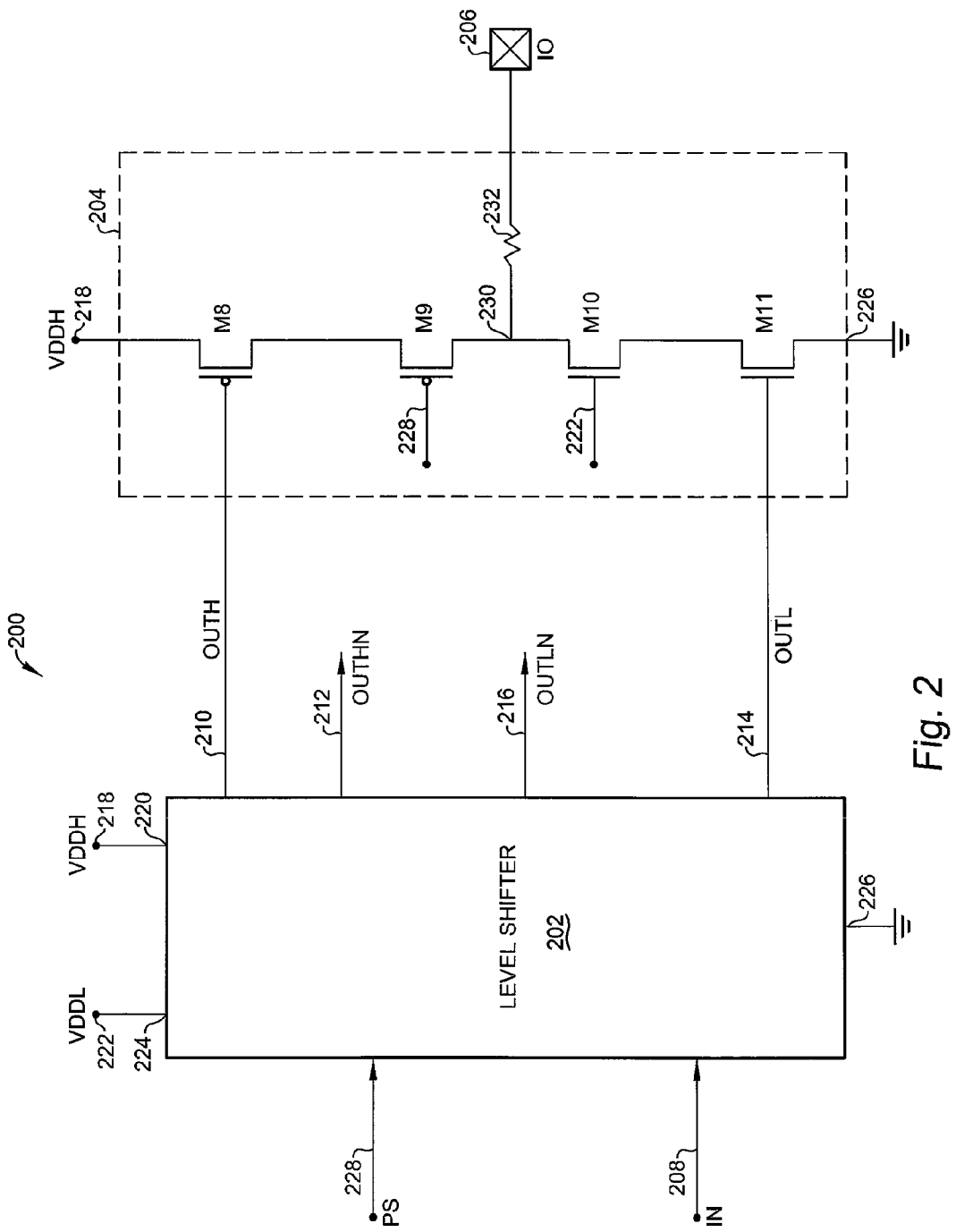
FIG. 2 illustrates a block diagram of an exemplary system embodying a level shifter, in accordance with an embodiment of the present subject matter.

FIG. 2 illustrates a block diagram of an exemplary system 200 embodying a level shifter 202, in accordance with an embodiment of the present subject matter. The system 200 includes the level shifter 202 coupled to a driver circuit 204. In one embodiment the system 200 may be an integrated circuit (IC) having numerous functional modules such as a core (not shown in the figure), a level shifter 202, a driver circuit 204, and one or more input/output (IO) pads, for example an IO pad 206. The explanation and details of well-known components are omitted for simplicity of the description.

The core includes circuits to perform various functions and also interacts with peripheral circuits through the IO pad 206. Generally, the core operates at a level of core supply voltage ($V_{CORE}$) that is lower than that of an IO voltage of the IO pad 206. For example, the core operates at a low voltage, say at about 1 V, while the IO pad 206 drives peripheral circuits operating at high voltage, for example, about 3.3 V. Due to the differences in standards between the core and the peripheral circuits, the level shifter 202 and the driver circuit 204 act as an interface between the core and the IO pad 206 to facilitate communication. The level shifter 202 and the driver circuit 204 drive load capacitance through the IO pad 206 to a requisite voltage level (i.e., high or low) for conveying a correct logic value (i.e., logic '1' or logic '0') of an output signal from the core.

The level shifter 202 receives the output signal, for example an input signal IN 208 from the core and generates a complementary pair of first level shifted outputs, i.e., high voltage level shifted signals OUTH 210 and OUTHN 212, which change their state in phase with the input signal IN 208. The level shifter 202 generates another pair of complementary second level shifted outputs, i.e., low voltage level shifted signals, namely OUTL 214 and OUTLN 216, which change their state in phase with the input signal IN 208.

A power supply VDDH 218 is coupled via a power supply node 220 to the level shifter 202. The voltage of the power supply VDDH 218 corresponds to a first output reference voltage level at which the input signal IN 208 is desired to be shifted. Thus, the values to which the input signal IN 208 is shifted depend on the power supply VDDH 218 and are obtained as the outputs OUTH 210 and OUTHN 212. Similarly, a low power supply VDDL 222 is coupled via a power supply node 224 to the level shifter 202. The voltage of the low power supply VDDL 222 corresponds to a second output reference voltage level for the level shifter 202. The voltage of the low power supply VDDL 222 corresponds to the maximum value of the level shifted signal OUTL 214 and OUTLN 216. Also, the level shifter 202 is grounded at a ground node 226.

In one embodiment, the level shifter 202 is configured in such a way that it can provide output of multiple voltage levels without using multiple external reference signals as used in conventional schemes. The level shifter 202 is configured to work in various modes like the low power output mode and the high power output mode using a level controller (not shown in this figure). However, it can be configured to work in other modes as well, as will be understood by a person skilled in the art. For example, the level shifter 202 may be configured to provide voltage outputs of 1.8 V in the low power output mode and 3.3 V in the high power output mode. The level shifter 202 may be selected to shift input signal IN 208 to multiple levels, for example, low voltage level such as 1.8 V and high voltage level such as 3.3 V, based on a level selection signal PS 228. The selection signal PS 228 is a logic signal, which may take a value of either '0' or '1' corresponding to a low and a high voltage. It may also be noted that the logic signals '0' and '1' are digital signals and can represent any value of voltage as per the circuit configuration. For example, '0' may correspond to 0 Volt and '1' may correspond to either 1 Volt, 1.2 Volts, 1.8 Volts or any other voltage depending on the circuit requirement.

In one embodiment, the system 200 may be provided with a selection control pin (not shown in the figure) to select the output voltage level required from the level shifter 202. The selection signal PS 228, based on the selection, may enable the level shifter 202 to provide the required output voltage as the OUTH 210. Further, based on the selection signal PS 228, the VDDH 218 may also vary, for example, between 1.8 V and 3.3 V. For example, the selection signal PS 228 at logic level '0' may enable the level shifter 202 to shift the input signal IN 208 to the low voltage level such as 1.8 V. Similarly, the selection signal PS 228 at logic level '1' may enable the level shifter 202 to shift the input signal IN 208 to the high voltage level such as 3.3 V.

The signals OUTH 210 and OUTL 214 are provided as inputs to the driver circuit 204, where the driver is configured to drive various peripheral devices coupled to the system 200 through the IO pad 206. The driver circuit 204 includes two pMOSs M8 and M9 and two nMOSs M10 and M11 coupled in series. The transistor M8 is coupled to the power supply VDDH 218 and receives the signal OUTH 210 at its gate terminal, whereas the transistor M11 is grounded at the ground terminal 226 and receives the signal OUTL 214 at its gate terminal. The gate of transistor M9 receives the selection signal PS 228 and the gate of transistor M10 is coupled to the power supply VDDL 222.

In operation, when the signal OUTL 214 is provided at the gate of the transistor M11, the transistor M8 gets triggered at high level of the signal OUTL 214 and pulls the transistor M10 to ground. Thus the IO pad 206 is grounded at high voltages of OUTL 214. However, when the signal OUTH 210 is provided at the gate of the transistor M8, the transistor M8 gets triggered at low levels of the signal OUTH 210 and conducts the voltage VDDH 218 at the source of the transistor M1. When the level shifter 202 is configured in the high power output mode, the gate of transistor M9 is driven to the VDDL 222 through the selection signal PS 228. Providing the VDDL 222 at the gate of transistor M9 prevents the transistor M9 from voltage stress. Since the source of the transistor M9 is at the VDDH 218, e.g., 3.3V, and the gate of the transistor M9 is at the VDDL 222, e.g., 1.8 V, therefore, the transistor M9 gets triggered and conducts the VDDH 218 to the IO pad 206 coupled to the driver circuit 204 at a node 230 through a resistor 232. When the level shifter 202 is configured in low power output mode the transistor M9 is provided with the selection signal PS 228 at logic level 0 that triggers the transistor M9 and conducts the voltage VDDH 218 to the IO pad 206 coupled to the driver circuit 204 at a node 230 through a resistor 232.

Figure 3:
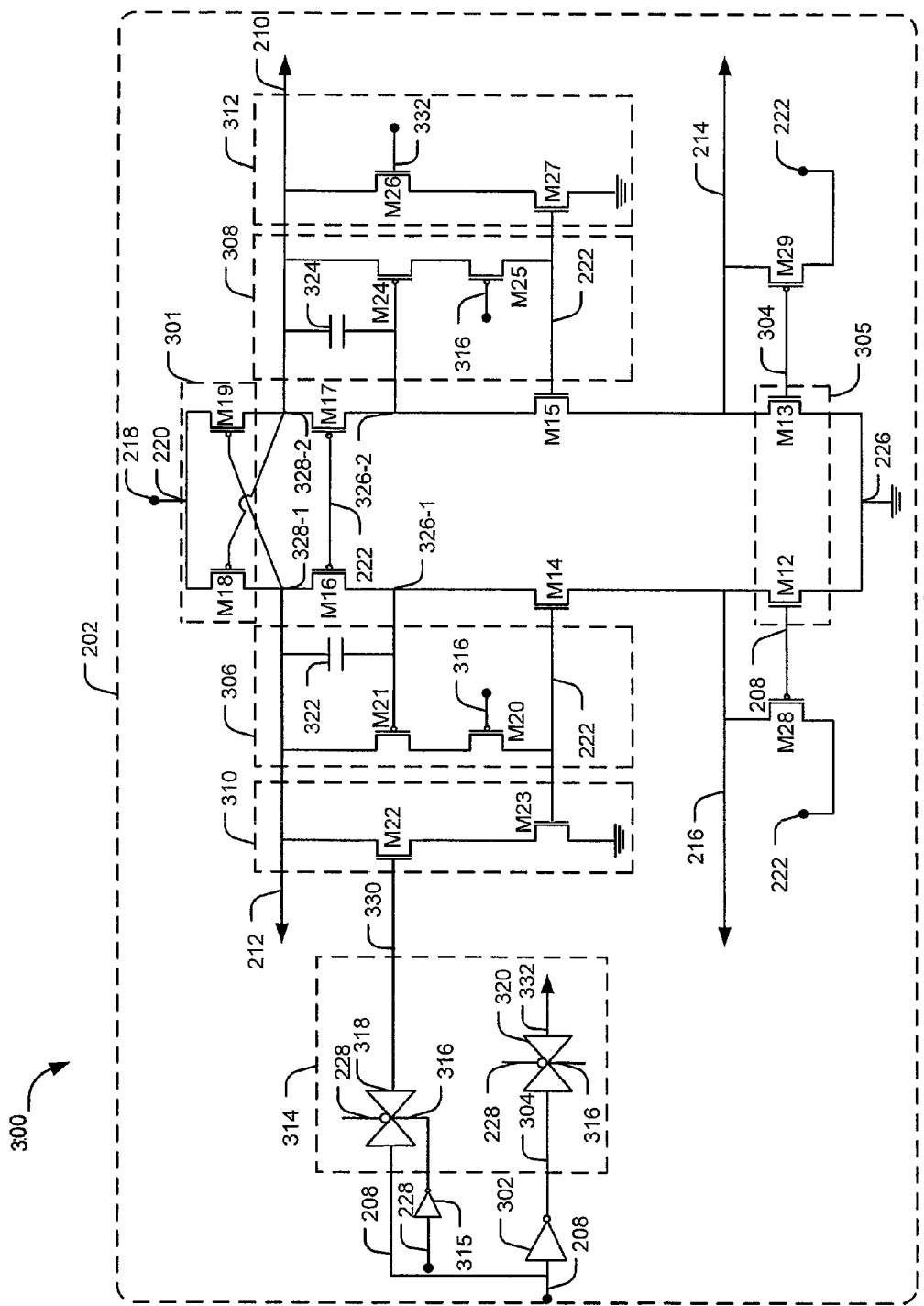
FIG. 3 illustrates a circuit configuration of an exemplary level shifter, in accordance with an embodiment of the present subject matter.

FIG. 3 illustrates a circuit configuration 300 of the level shifter 202, in accordance with an embodiment of the present subject matter. In said embodiment, the level shifter 202 is implemented using both 32 Å pMOS and nMOS, M12, . . . M29 as transistors. The configuration as shown here is an exemplary configuration and other configurations, as will be understood by a person having ordinary skill in the art, may be possible. The connections between the transistors are depicted in the circuit diagram 300. Additionally, descriptions and details of well-known components are omitted for simplicity of the description.

As explained in the description of FIG. 1, the power supply VDDH 218 is coupled via a power supply node 220 to the level shifter 202. The voltage of the power supply VDDH 218 corresponds to a voltage level to which an input signal IN 208, of the level shifter 202 is desired to be shifted. Thus, the level shifted values of the input signal IN 208 of the level shifter 202 depend on the power supply VDDH 218 and are obtained as the first level shifted outputs, i.e., OUTH 210 and OUTHN 212 through output stage transistors 301. In one embodiment, the output stage transistors 301 include a first output stage transistor M19 and a second output stage transistor M18. Similarly the power supply VDDL 222 is coupled via a power supply node 224 to the level shifter 202. The voltage of the power supply VDDL 222 corresponds to the second output reference voltage level for the level shifter 202. The second output reference voltage corresponds to the maximum value of the level shifted signal OUTL 214 and OUTLN 216. Also, the level shifter 202 is grounded at the ground node 226.

The input signal IN 208 is applied to an inverter 302 to receive an inverted input signal IN-N 304. The input signals IN 208 and IN-N 304 are logic signals, which may take a value of either '0' or '1' corresponding to a low and a high voltage. It may also be noted that the logic signals '0' and '1' are digital signals and can represent any value of voltage as per the circuit configuration. For example, '0' may correspond to 0 V and '1' may correspond to either 1V, 1.2 V, 1.8 V or any other voltage depending on the circuit requirement. The input signal IN 208 and the inverted input signal IN-N 304 are provided to two input stage transistors, i.e., the two nMOS transistors M12 and M13 and also to the two pMOS transistors M28 and M29. Specifically, the input signal IN 208 is applied at the gate of a first input stage transistor M12, the transistor M28, and to the inverter 302. The inverted input signal IN-N 304 is applied at the gate of a second input stage transistor M13 and the transistor M29. The first input stage transistor M12 and the second input stage transistor M13 may be collectively referred to as input stage transistors 305.

As described earlier, the level shifter 202 is configured to work in various modes like the low power output mode and the high power output mode using the level controller. In one embodiment, the level shifter includes a high level controller (306, 308) and a low level controller (310, 312). For example, when the level shifter 202 is operated in the high power output mode, a first high level controller 306 and a second high level controller 308 are triggered. Whereas, a first low level controller 310 and a second low level controller 312 are enabled when the low power supply mode is desired.

The low power output mode and the high power output mode are enabled using the selection signal PS 228. The selection signal PS 228 is applied to a configuration circuit 314 and another inverter 315. The output of the inverter 315, i.e. a complementary selection signal PSN 316 is applied to the configuration circuit 314 and at the gate of the transistor M20 and the transistor M25. The configuration circuit 314 includes a first transmission gate 318 and a second transmission gate 320. The first transmission gate 318 and the second transmission gate 320 are controlled by the selection signal PS 228 and the complementary selection signal PSN 316. In one embodiment, the selection signal PS 228 at logic level 0 enables the transmission gates 318 and 320 and in turn enables the low power output mode and disables the high power output mode. On the other hand, the selection signal PS 228 at logic level 1 disables the transmission gates 318 and 320, whereas the complementary selection signal PSN 316, which is now at logic level 0, enables the high power output mode and disables the low power output mode.

HIGH POWER OUTPUT MODE: The high power output mode, in one embodiment is enabled when the complementary selection signal PSN 316 is at a logic level 0. The complementary selection signal PSN 316 is applied as a gating signal to pMOS transistors M20 and M25 of the first high level controller 306 and the second high level controller 308, respectively. The first high level controller 306 includes the pMOS transistors M20, M21, and a capacitor 322, whereas the second high level controller 308 includes the pMOS transistors M25, M24 and a capacitor 324. The source terminals of the transistors M20 and M25 are coupled to the power supply VDDL 222.

To elucidate the working of the level shifter 202 at the high power output mode, the input signal IN 208 may be considered to be at the logic level 1 and accordingly the inverted input signal IN-N 304 may be at the logic level 0. The input signal IN 208 received at the gate of the nMOS transistor M12 and at the gate of the pMOS transistor M28 switches ON the transistor M12, however, the transistor M28, being a pMOS transistor, gets switched OFF. Similarly, the inverted input signal IN-N 304 being provided at the gate of the nMOS transistor M13 and at the gate of the pMOS transistor M29, switches ON the transistor M29, however, the transistor M13 gets switched OFF. The transistor M29 when in saturation provides the power supply VDDL 222, applied at the source of the transistor M29, as the OUTL 214. For example, the power supply VDDL 222 may be 1.8 V.

Similarly, the transistor M12 gets triggered by the input signal IN 208 and as a result, the transistor M12 discharges the OUTLN 216 to ground voltage, i.e., zero V. Further, the transistor M12 pulls the transistor M14, which is triggered by the power supply VDDL 222, down towards the ground 226. The ground voltage thus appears at a node 3261 and switches the pMOS transistor M21 ON. The transistor M20 receives the selection control signal PSN 316 at its gate terminals and conducts the power supply VDDL 222 to the transistor M21 and in turn to a reference node 3281. The power supply VDDL 222 when provided at the node 3281 acts as a high reference voltage for the transistor M19. Thus, the use of the high level controller 306 ensures that the gate voltage applied to the transistor M19 is VDDL 222 and not (VDDL+threshold voltage (Vt)) as in the conventional systems.

Further, as will be known to a person skilled in the art, for a transistor to conduct the difference between the source voltage and the gate voltage needs to be more than the threshold voltage of the transistor. Providing a gate voltage of VDDL 222 ensures that the source voltage required for the transistor M19 is greater than (VDDL+Vt of the transistor M19), instead of (VDDL+2*Vt) as in the conventional system. For example, assuming VDDL 222 to be 1.8 V and the threshold voltage of the 32 Å transistors to be 0.7 V, the gate voltage applied to the transistor M19 due to the leakage in the conventional systems is equal to 2.5 V, thus the source voltage needs to be more than (2.5+0.7) V, i.e., 3.2 V, in other words, the difference in the gate voltage and the source voltage required in the conventional system was 1.4 V instead of 0.7 V. However, in the level shifter 202, by providing the high reference voltage, i.e., the VDDL 222, the difference between the gate voltage and the source voltage required is only 0.7 V, thus ensuring that for an input signal of 1.8 V the output may be as low as 3.0 V, thus providing a larger range of level shifted signal OUTH 208.

The transistor M19 is coupled to the reference node 3281, and is switched ON when the power supply VDDL 222 is applied at the reference node 3281. As a result, the transistor M19 provides the OUTH 210 based on the VDDH 218. Similarly, the OUTHN 212 is received from the reference node 3281. Thus, for the selection signal PS at logic level 1 and the input signal IN 208 at logic level 1, the value of OUTL 214, OUTLN 216, OUTH 210, and OUTHN 212 is VDDL 222, zero V, VDDH 218, and VDDL 222 respectively.

Similarly, for the selection signal PS at logic level 1 and the input signal IN 208 at logic level 0, the transistor M13 pulls the transistor M15, which is triggered by the power supply VDDL 222, down towards the ground 226. The ground voltage thus appears at a node 3262 and switches the pMOS transistor M24 ON. Further, the transistor M25 receives the selection control signal PSN 316 at its gate terminals and conducts the power supply VDDL 222 to the transistor M24 and in turn to a reference node 3282. The transistor M18 is coupled to the reference node 3282, and is switched ON when the power supply VDDL 222 is applied at the reference node 3282. As a result, the transistor M18 provides the OUTHN 210 based on the VDDH 218. Thus, the value of OUTL 214, OUTLN 216, OUTH 210, and OUTHN 212 is zero V, VDDL 222, VDDL 222, and VDDH 218 respectively. The value of the VDDL 222, for example, may be 1.8 V, and the value of VDDH 218, for example, may be 3.3 V.

The level shifter 202 in the high power output mode thus provides an output signal in the range of VDDL 222 and VDDH 218, for example, the level shifted signal received is a 1.8 V to 3.3 V level shifted signal. Further, the level shifter 202 is implemented using high speed 32 Å transistors, this enables the level shifter 202 to swiftly attain a change of state between the various output voltages. Hence, the speed of operation of the level shifter 202 is enhanced.

Further, using the capacitors 322 and 324 makes the transition of the input signal IN 208 on the OUTHN 212 and the OUTH 210 faster due to the coupling effect and ensures that the cascaded transistors M16 and M17 do not get voltage stress during the transition of signal and hence increase the reliability of the level shifter 202.

LOW POWER OUTPUT MODE: The low power output mode, in one embodiment, is enabled when the selection signal PS 228 is at a logic level 0, and accordingly the complementary selection signal PSN 316 is at a logic level 1. The selection signal PS 228 and the complementary selection signal PSN 316 are applied at the first transmission gate 318 and the second transmission gate 320. The first transmission gate 318 receives the input signal IN 208 and provides a first gating signal 330 to the nMOS transistor M22 of the first low level controller 310. Similarly the second transmission gate 320 receives the inverted input signal IN-N 304 and provides a second gating signal 332 to the nMOS transistor M26 of the second low level controller 312. The value of the first gating signal 330 and the second gating signal 332, applied at the gates of the transistors M22 and M26, is for example, 1.8 V. The first low level controller 310 includes the nMOS transistors M22 and M23, whereas the second low level controller 312 includes the nMOS transistors M26 and M27. The transistors M23 and M27 are grounded to receive the power supply VDDL 222 as the gate voltage.

To elucidate the working of the level shifter 202 at the low power output mode, the input signal IN 208 may be considered to be at the logic level 1 and accordingly the inverted input signal IN-N 304 may be at the logic level 0. The input signal IN 208 being provided at the gate of the nMOS transistor M12 and at the gate of the pMOS transistor M28 switches ON the transistor M12, however, the transistor M28, being a pMOS transistor, gets switched OFF. Similarly, the inverted input signal IN-N 304 being provided at the gate of the nMOS transistor M13 and at the gate of the pMOS transistor M29, switches ON the transistor M29, however, the transistor M13 gets switched OFF. The transistor M29 on being switched ON conducts the power supply VDDL 222, applied at the source of the transistor M29, as the OUTL 214. For example, the power supply VDDL 222 may be 1.8 V.

Similarly, the transistor M12 gets switched ON by the input signal IN 208 and is pulled down towards the ground 226. As a result, the transistor M12 discharges the OUTLN 216 to ground voltage, i.e., zero V. Further, the transistor M12 pulls the transistor M14, which is triggered by the power supply VDDL 222, down towards the ground 226. Further, as the VDDL 222 is also applied across the transistor M23, the transistor M23 is switched ON and is pulled down towards the ground 226. As a result, the transistor M23 pulls the transistor M22 down towards the ground 226. The transistor M22 thus discharges the OUTHN 212 to ground voltage, i.e., zero V. Further, the reference node 3281 is discharged to the ground voltage as a low reference voltage for transistor M19. The low reference voltage when applied at gate terminals of the transistor M19 switches ON the transistor M19 and as a result, the transistor M19 conducts the VDDH 218 as the OUTH 210. Thus, for the selection signal PS at logic level 0 and the input signal IN 208 at logic level 1, the value of OUTL 214, OUTLN 216, OUTH 210, and OUTHN 212 is VDDL 222, zero V, VDDH 218, and zero V respectively. Similarly, for the selection signal PS at logic level 0 and the input signal IN 208 at logic level 0, the value of OUTL 214, OUTLN 216, OUTH 210, and OUTHN 212 is zero V, VDDL 222, zero V, and VDDH 218 respectively. The value of VDDL 222, for example, may be 1.8 V, and the value of VDDH 218, for example, may be 1.8 V.

The level shifter 202 is thus able to provide multiple outputs, for example of 1.8 V and 3.3 V using the high level controllers 302, 306 and the low level controllers 308, 310. Using the high level controllers 302, 306 further prevents the leakage of threshold voltage at the reference node. Further, the level shifter 202 due to the use of 32 Å thick oxide transistors, for example, of 32 Å operates at high speed and has a reduced chip area.

Figure 4:
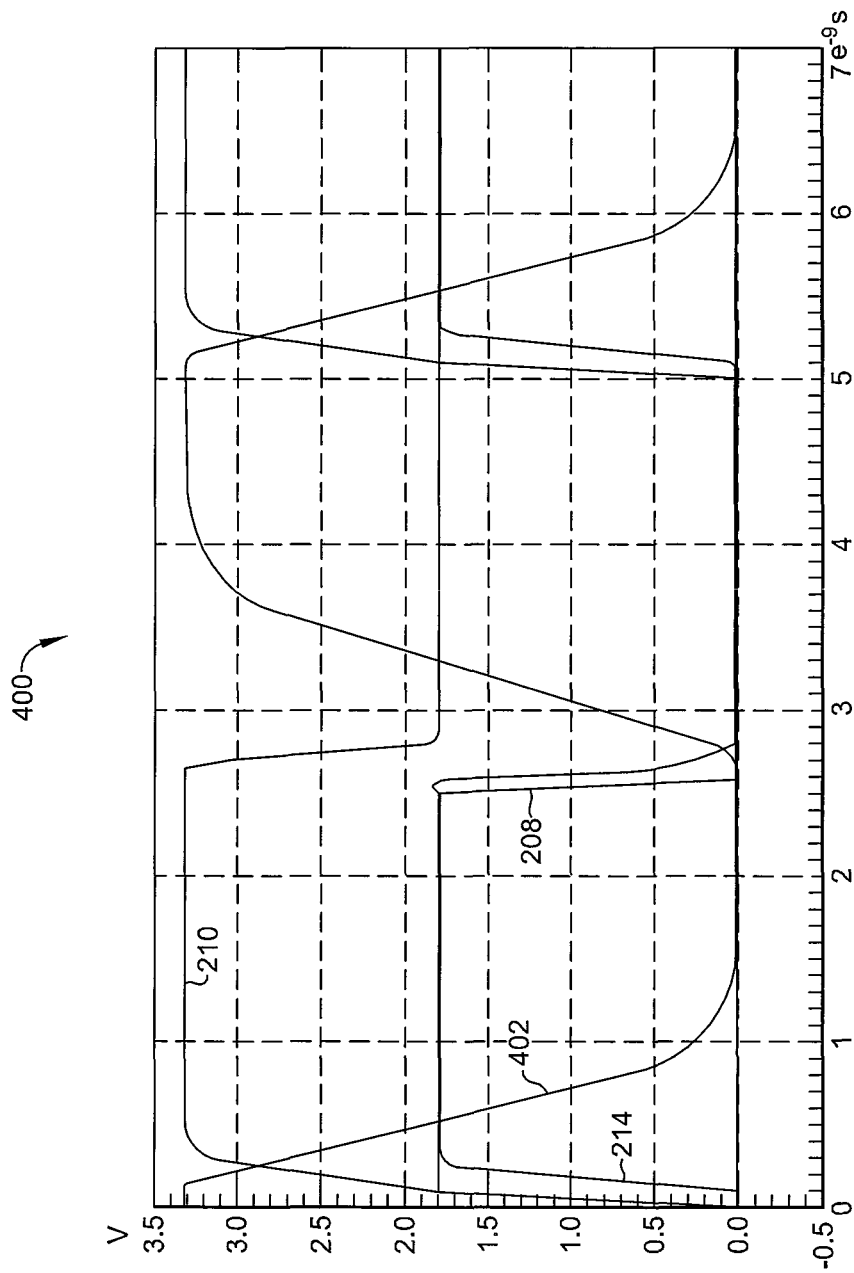
FIG. 4 illustrates a graph depicting simulation results for a high power output mode of the exemplary level shifter, in accordance with an embodiment of the present subject matter.

FIG. 4 illustrates a graph 400 depicting simulation results for the high power output mode of the level shifter 202. The graph 400 depicts, in Volts (V), the value of OUTH 210, OUTL 214, and signal 402 across the IO pad 206 corresponding to input signal IN 208. As shown, the input signal IN 208, that varies from zero volts to VDDL 222, is level shifted to receive a level shifted signal, i.e., OUTH 210 varying from VDDL 222 to VDDH 218. The signal 402 varies from zero volts to VDDH 218. Thus, in the high power output mode the level shifter 202 provides a voltage in the range of zero volts to VDDH 218 across the pad 206. For illustration purposes, the value of input signal IN 208 is varied in the range of zero V to 1.8 V, the value of VDDL 222 is kept as 1.8 V, and the value of VDDH 218 is kept as 3.3 V. The level shifter 202 thus provides the voltage across the pad 206 in the range of zero V to and including 3.3 V.

Figure 5:
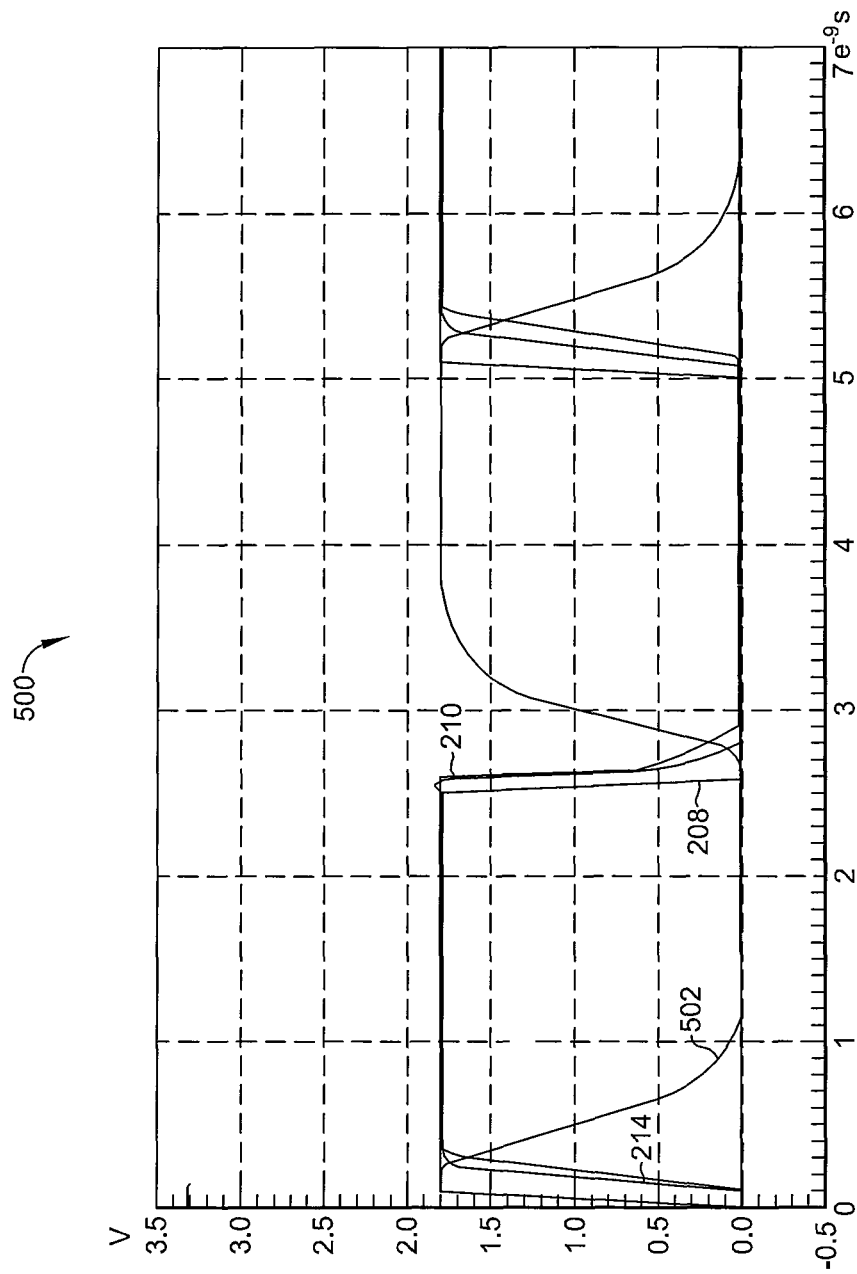
FIG. 5 illustrates a graph depicting simulation results for a low power output mode of the exemplary level shifter, in accordance with an embodiment of the present subject matter.

FIG. 5 illustrates a graph 500 depicting simulation results for the low power output mode of the level shifter 202. The graph 500 depicts, in Volts (V), the value of OUTH 210, OUTL 214, and the signal 502 across the IO pad 206 corresponding to input signal IN 208. As shown, the input signal IN 208, that varies from zero volts to VDDL 222, is level shifted to a level shifted signal, i.e., OUTH 210 varying from zero volts to VDDH 218. The signal 502 varies from zero volts to VDDH 218. Thus, in the low power output mode the level shifter 202 provides a voltage in the range of zero volts to VDDH 218 across the pad 206. For illustration purposes, the value of input signal IN 208, VDDL 222, and the VDDH 218 is kept in the range of zero V to 1.8 V. The level shifter 202 thus provides the voltage across the pad 206 in the range of zero V to and including 1.8 V.

It will be understood that the above illustration is just for the purpose of explaining the present subject matter, and should not be, in any way, construed as limiting.

Although embodiments for level shifter have been described in language specific to structural features and/or methods, it is to be understood that the invention is not necessarily limited to the specific features or methods described. Rather, the specific features and methods are disclosed as exemplary embodiments for the level shifter.

We claim:

1. A level shifter comprising:
   at least one output stage transistor to provide a first level shifted output based on a first output reference voltage;
   at least one cascaded transistor having a current path in common with the at least one output stage transistor, and having a gate coupled to a second output reference voltage;
   at least one level controller configured to provide a reference voltage at a gate terminal of the at least one output stage transistor based at least on a selection signal; and
   at least one input stage transistor to provide a second level shifted output at the second output reference voltage based at least on an input signal,
   wherein the first and second output reference voltages comprise power supply voltages.

2. The level shifter as claimed in claim 1, wherein the reference voltage is selected from one of a high reference voltage and a low reference voltage such that a difference between the reference voltage and the first output reference voltage is more than a threshold voltage of the at least one output stage transistor.

3. The level shifter as claimed in claim 1, wherein the first output reference voltage is one selected from a high voltage level and a low voltage level based at least on the selection signal, and wherein the level shifter operates in one of a high power mode and a low power mode, based on the first output reference voltage.

4. The level shifter as claimed in claim 1, wherein the at least one level controller is one selected from a high level controller and a low level controller based on the selection signal.

5. The level shifter as claimed in claim 4, wherein the high level controller triggers the at least one output stage transistor to provide the first output reference voltage at a high voltage level.

6. The level shifter as claimed in claim 4, wherein the low level controller triggers the at least one output stage transistor to provide the first output reference voltage at a low voltage level.

7. The level shifter as claimed in claim 4 further comprising a configuration circuit configured to enable the low level controller to provide a low reference voltage based at least on the selection signal, wherein the low reference voltage triggers the at least one output stage transistor to provide the first output reference voltage at a low voltage level.

8. The level shifter as claimed in claim 1, wherein the level shifter is configured to operate in a high power output mode when the selection signal is at a high logic level.

9. The level shifter as claimed in claim 1, wherein the level shifter is configured to operate in a low power output when the selection signal is at a low logic level.

10. The level shifter as claimed in claim 1, wherein the level shifter is implemented using transistors having oxide thickness of about 32 Angstrom.

11. A system comprising:
    at least one of a first output stage transistor and a second output stage transistor to selectively provide a first level shifted output based on a first output reference voltage based on an input signal;
    at least one of a first high level controller and a second high level controller, wherein the first high level controller is configured to provide a high reference voltage at a gate terminal of the first output stage transistor and the second high level controller is configured to provide the high reference voltage at a gate terminal of the second output stage transistor; and
    at least one of a first low level controller and a second low level controller, wherein the first low level controller is configured to provide a low reference voltage at a gate terminal of the first output stage transistor and the second low level controller is configured to provide the low reference voltage at a gate terminal of the second output stage transistor,
    wherein at least one of the first high level controller and the second high level controller provides the high reference voltage when a selection signal is at a high logic level, and wherein the high reference voltage triggers the output stage transistors to provide the first output reference voltage at a high voltage level.

12. The system as claimed in claim 11 further comprising a configuration circuit configured to enable at least one of the first low level controller and the second low level controller to provide the low reference voltage when a selection signal is at a low logic level, wherein the low reference voltage triggers the output stage transistors to provide the first output reference voltage at a low voltage level.

13. The system as claimed in claim 11, wherein each of the first high level controller and the second high level controller comprises a pair of transistors coupled to a low power supply to provide the high reference voltage.

14. The system as claimed in claim 13, wherein each of the first high level controller and the second high level controller further comprises at least one capacitor coupled to the pair of transistors and at least one cascaded transistor, the at least one capacitor being configured to prevent voltage stress across the at least one cascaded transistor.

15. The system as claimed in claim 11 further comprising a driver circuit coupled to the at least one of the first output stage transistor and the second output stage transistor, wherein the driver circuit is configured to receive the first level shifted output as input.

16. A system comprising:
- at least one of a first output stage transistor and a second output stage transistor to selectively provide a first level shifted output based on a first output reference voltage based on an input signal;
- at least one of a first high level controller and a second high level controller, wherein the first high level controller is configured to provide a high reference voltage at a gate terminal of the first output stage transistor and the second high level controller is configured to provide the high reference voltage at a gate terminal of the second output stage transistor; and
- at least one of a first low level controller and a second low level controller, wherein the first low level controller is configured to provide a low reference voltage at a gate terminal of the first output stage transistor and the second low level controller is configured to provide the low reference voltage at a gate terminal of the second output stage transistor, wherein each of the first high level controller and the second high level controller comprises a pair of transistors coupled to a low power supply to provide the high reference voltage, and wherein each of the first high level controller and the second high level controller further comprises at least one capacitor coupled to the pair of transistors and at least one cascaded transistor, the at least one capacitor being configured to prevent voltage stress across the at least one cascaded transistor.

* * * * *